US005644526A

United States Patent [19]

Mazzali

[11] Patent Number: 5,644,526
[45] Date of Patent: Jul. 1, 1997

[54] INTEGRATED CIRCUIT WITH IMPROVED IMMUNITY TO LARGE METALLIZATION DEFECTS

[75] Inventor: Stefano Mazzali, Milan, Italy

[73] Assignee: SGS-Thomson Microelectronics S.r.l., Agrate Brianza, Italy

[21] Appl. No.: 538,302

[22] Filed: Oct. 2, 1995

[30] Foreign Application Priority Data

Sep. 30, 1994 [EP] European Pat. Off. ............. 94830468

[51] Int. Cl.⁶ .................... G11C 5/02; G11C 5/06; G11C 11/50; G11C 11/34
[52] U.S. Cl. .................... 365/51; 365/63; 365/164; 365/185.05; 365/185.33
[58] Field of Search ........................ 365/51, 63, 164, 365/185.09, 185.05, 185.33; 371/21.1, 21.3

[56] References Cited

U.S. PATENT DOCUMENTS

| | | | |
|---|---|---|---|
| 4,777,387 | 10/1988 | Collins | 327/109 |
| 4,827,449 | 5/1989 | Inoue | 365/63 |
| 4,833,342 | 5/1989 | Kiryu et al. | 323/313 |
| 5,467,316 | 11/1995 | Kim et al. | 365/63 |

*Primary Examiner*—David C. Nelms
*Assistant Examiner*—Trong Quang Phan

[57] ABSTRACT

The integrated circuit tolerant of large manufacturing defects comprising a first plurality of first conductors made of a first material with relatively low conductivity and each having a plurality of first electrical connection points arranged along itself and a second corresponding plurality of second conductors made of a second material with relatively high conductivity and each having a plurality of second electrical connection points arranged along itself and said plurality of first points are electrically connected to said plurality of second points respectively in such a manner as to reduce the series resistance of the first conductors and the second conductors are interrupted between some second consecutive points in such a manner as to leave relatively large areas of the integrated circuit not traversed by the second conductors.

35 Claims, 4 Drawing Sheets

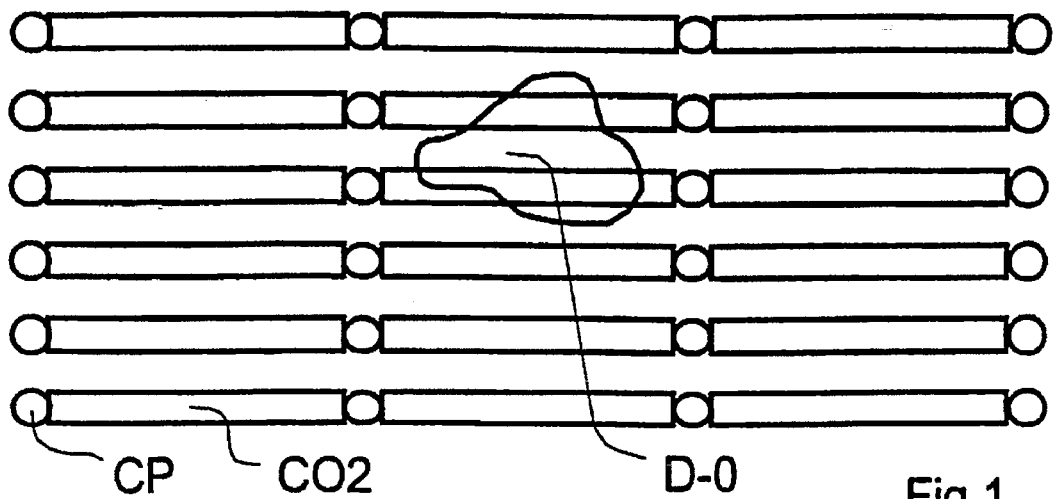
Fig. 1
(PRIOR ART)
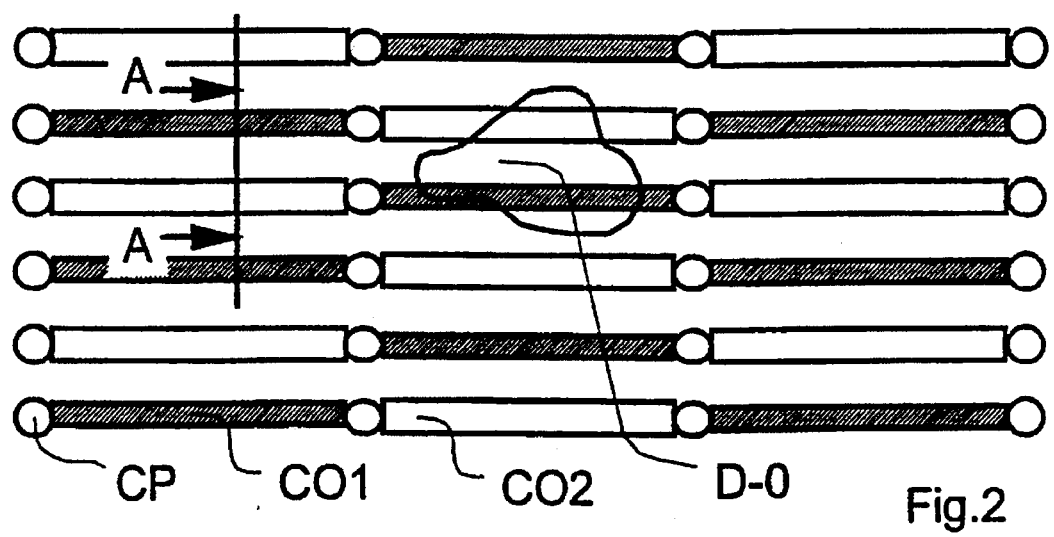
Fig. 2
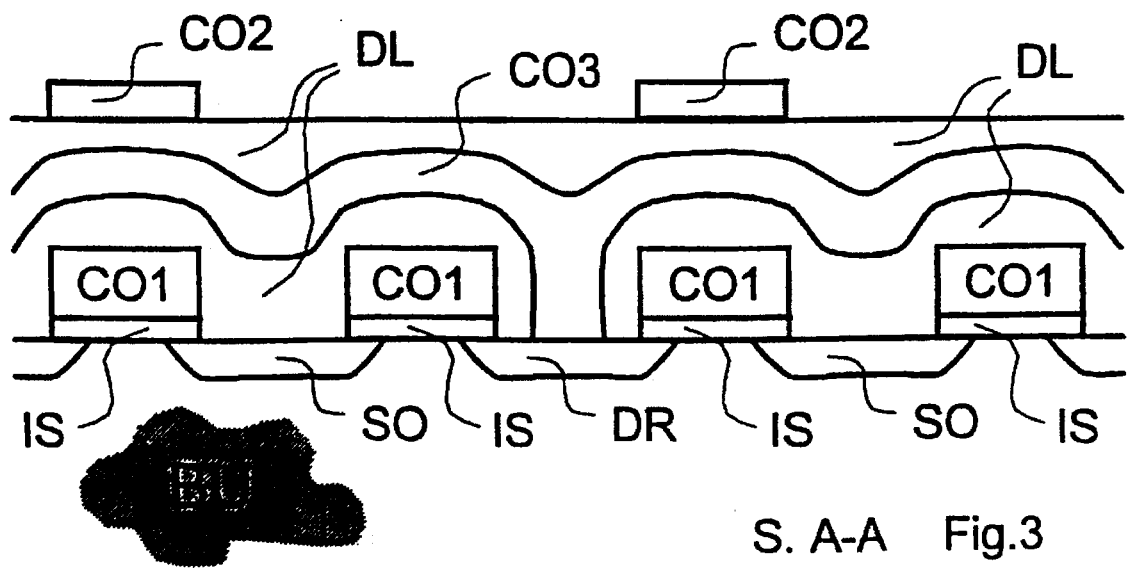
S. A-A   Fig. 3

D-1  D-2  D-3

D-1  D-2  D-3

INTEGRATED CIRCUIT WITH IMPROVED IMMUNITY TO LARGE METALLIZATION DEFECTS

CROSS-REFERENCE TO RELATED APPLICATION

This application claims priority from EPC App'n 94830468.8, filed Sep. 30, 1994, which is hereby incorporated by reference. However, the content of the present application is not necessarily identical to that of the priority application.

BACKGROUND AND SUMMARY OF THE INVENTION

The present invention relates to strapping connections in integrated circuit memory structures.

Memory devices always comprise at least one cell matrix comprising a plurality of rows, a plurality of columns and, in correspondence with each crossing between the rows and columns, a more or less complex memory cell. The rows and columns consist generally of electrical conductors made of silicide or polysilicon which are materials with relatively low conductivity.

Since memories have ever growing capacities and must meet stringent specifications as regards access time, many manufacturers have elected memory devices where the rows are provided conventionally while the columns are provided of metallic materials having relatively high conductivity and making them from a first metallic layer (metal-1).

To make the devices still faster it has been necessary to reduce the series resistance of the rows. This was conventionally achieved by means of another plurality of electrical conductors running parallel to and superimposed on the conductors of the rows and contacted therewith by means of the opening of VIAs every certain number of memory cells as may be seen in FIG. 1. The conductors of said additional plurality are made of metallic materials having relatively high conductivity and making them from a second metallic layer (metal-2).

The process for making from the second metallic layer the additional plurality of conductors is subject to even larger defects for a variety of reasons, one of the many of which is the difficulty of planarization of the underlying structure. Said defects result in short circuiting of two or more adjacent conductors (depending on the size of the defect, as may be seen in FIG. 1.

It is common practice to obviate said defects by providing redundant rows. In general, redundancy is limited to short circuits between two adjacent rows for reasons of failure frequency and redundancy management circuitry simplicity and, for flash EPROM memories, the space occupied by the row and/or column decoding circuitry.

Indeed, flash EPROM memory devices can be erased only in their entirety while they can be written one cell at a time. If a cell were never written but repeatedly erased (together with the others) it would be "emptied" in a short time and this would lead to read errors for the cells located in the same column. To obviate this shortcoming, before any erasing phase of the device there is a "preconditioning" phase affecting individually all the cells of the device (those of the perfectly operating rows, the defective ones and also the redundant ones) and consisting of writing the cells not already written by injecting charges in the insulated gate of the MOS transistor which makes them up. When a write operation is executed in a row exhibiting a short circuit it is necessary anyway that the cells making it up be actually written so as to avoid future read errors. To do this, stronger and more cumbersome generators are needed in proportion to the stronger current needed to pilot the row despite the short circuit, and this depends on the number of short circuited rows and the size of the defect. Present integration levels do not allow dedicating to said generators a very big area on the chip. Consequently, only short circuits between two adjacent rows are made redundant. The short circuit of multiple rows constitutes an obstacle to operation of the entire device and cannot be accepted nor managed by means of software or firmware avoiding the use of such defective rows (this is naturally true only for flash EPROM memory devices) and hence results in rejection of the device.

This problem is encountered more generally in all the integrated circuits comprising a first plurality of first conductors made of a first relatively low-conductivity material with each having a plurality of first electrical connection points arranged along itself and a second corresponding plurality of second conductors made of a second relatively high-conductivity material with each having a plurality of second electrical connection points arranged along itself and in which said pluralities of first points are electrically connected to said plurality of second points respectively in such a manner as to reduce the series resistance of the first conductors. This is naturally independent of the absolute and mutual arrangement on the integrated circuit, the materials, and the manufacturing process for making the conductors provided this can cause large defects.

The purpose of the present invention is to provide an integrated circuit having a structure such as to be tolerant of large manufacturing defects.

Said purpose is achieved by means of the integrated circuit of the above mentioned type in which strapping connections, formed in an additional thin film layer, each connect two separate locations of a respective one of said word lines to shunt the resistivity of a respective portion of said respective word line; and the strapping connections are arranged, in groups, in a checkerboard pattern over said array. Further advantageous features of the present invention are set forth in the dependent claims.

In accordance with another aspect, the present invention also concerns a memory device where the innovative strapping lines are used to shunt word lines.

By having the second conductors interrupted between some second consecutive points in such a manner as to leave relatively large areas of the integrated circuit not traversed by the second conductors, the probability that a defect would affect two conductors, causing a short circuit between them, is reduced and for three conductors it is reduced even further.

The resulting increase in the series resistance is acceptable in particular for memory devices. Furthermore, thanks to the use of redundant rows for said devices, rejects due to manufacturing defects and in particular those linked to the second metallic layer are practically eliminated.

BRIEF DESCRIPTION OF THE DRAWINGS

The disclosed inventions will be described with reference to the accompanying drawings, which show important sample embodiments of the invention and which are incorporated in the specification hereof by reference, wherein:

The invention is clarified by the description set forth below considered together with the annexed drawings wherein:

FIGS. 1 and 4 show top views of second conductors in accordance with the known art, FIGS. 2, 5 and 7 show top views of first and second conductors in accordance with the present invention, and FIG. 3 shows a cross section view along plane of cut A—A of the conductors of FIG. 2.

DETAILED DESCRIPTION OF THE PREFERRED EMBODIMENTS

The numerous innovative teachings of the present application will be described with particular reference to the presently preferred embodiment (by way of example, and not of limitation), in which:

FIG. 1 shows a second plurality made up of six second metallic conductors CO2 which exhibit various electrical connection points opposite positions CP. Said conductors could be electrically connected as word lines of a memory matrix. Beneath the second conductors CO2 and along their entire length there is a corresponding first plurality made up of six first conductors CO1 (not shown in FIG. 1), e.g. silicide, exhibiting various electrical connection points opposite the positions CP. Again opposite the positions CP there are provided VIAs permitting electrical connection between the conductors CO1 and the conductors CO2. FIG. 1 shows a defect D-0 such as to short circuit two adjacent conductors CO2.

FIG. 2 shows the second conductors CO2 of FIG. 1 as modified in accordance with the present invention. As may be seen, these are interrupted every two consecutive points CP and the breaks are in alternating positions. In the areas where the conductors CO2 are interrupted, the conductors CO1 are visible, while the conductors CO1 are hidden by the conductors CO2 in the remaining areas. In this way there remains relatively large integrated circuit areas not traversed by conductors CO2. This means, for example, that the defect D-0 no longer causes any short circuit between the conductors CO2.

Naturally the arrangement of the conductors CO1 depends on the specific application of the integrated circuit. In the case of memory devices they are parallel with each other, while in another case they could, for example, be arranged as the spokes of a wheel.

Figure 5:
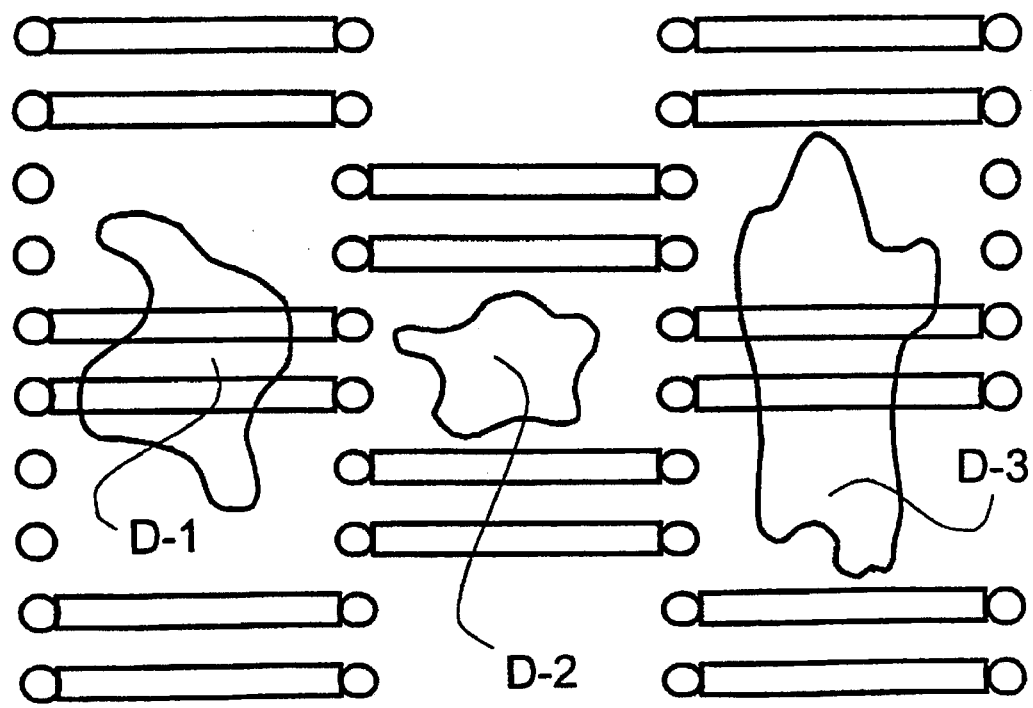

As mentioned above, the positions of the breaks in the conductors CO2 are determined in such a manner as to leave relatively large areas of the integrated circuit not traversed by the second conductors CO2. These depend thus on the mutual positions of the conductors and the size of the defects which it is intended to tolerate. FIGS. 2 and 5 show two of the many possible choices.

In the case of memory devices the positions CP are found in general at a constant distance every certain number of memory cells, e.g. 512. In other applications this might not be the optimal choice. In general the positions CP are determined on the basis of considerations on the electrical signal propagation time in the conductors CO1 and hence depend also on the type and number of electronic devices connected thereto.

In view of the need for electrical connection, the conductors CO2 are advantageously of the same type as the conductors CO1 and are superimposed thereon. The electrical connection is then completed by means of VIAs. Naturally this is not indispensable for the purposes of the present invention.

FIG. 3 shows a cross section view along plane of section A—A of the conductors of FIG. 2 as if these belonged to a memory device.

In the cross section of FIG. 3 are shown the first conductors CO1 which act as word lines of a memory device and are arranged above a substrate BU and separated therefrom by insulating layers IS. In the substrate BU are made pockets SO and DR which act as source and drain areas respectively for MOS devices constituting memory cells. Above said structure is a dielectric layer DL in which are arranged third metallic conductors CO3 acting as bit lines of the memory device. Above the dielectric layer DL are second conductors CO2 opposite some of the first conductors CO1.

As mentioned above, the present invention finds advantageous application in memory devices. With the aid of FIGS. 4 and 5 there is explained below an embodiment thereof suited specifically thereto.

As mentioned at the beginning, it is common practice to provide in memory devices redundant rows to obviate short circuits between two adjacent rows due to manufacturing defects.

Figure 4:
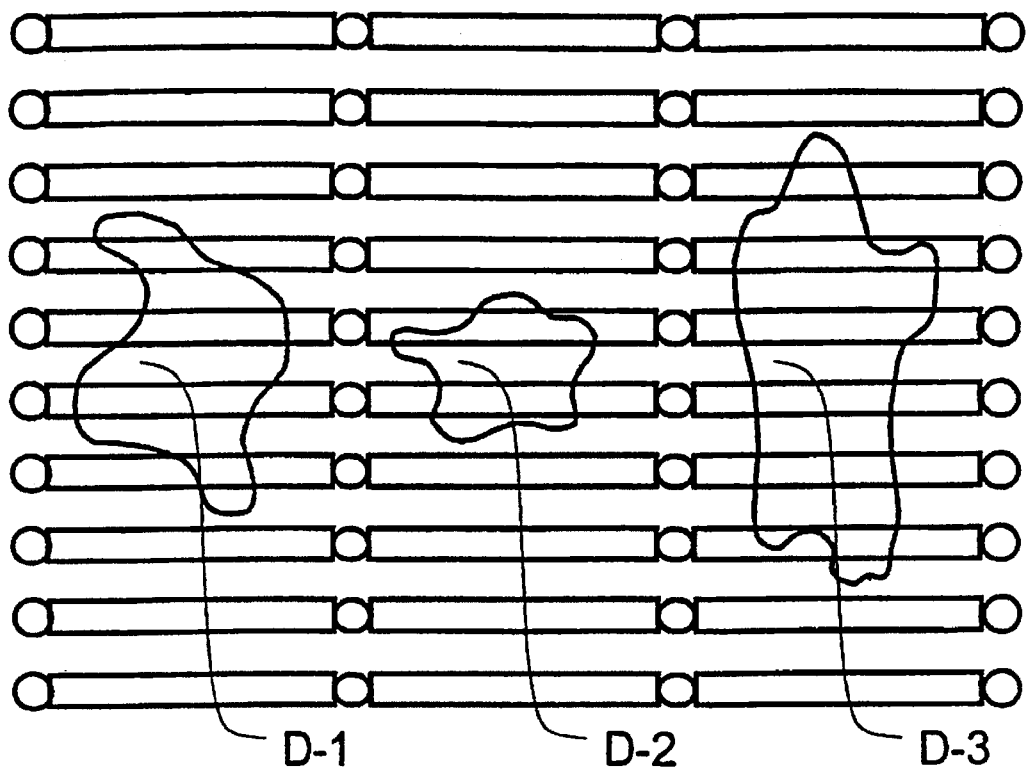

FIG. 4 shows a plurality of rows of such a memory device and three defects D-1, D-2 and D-3 caused by the process for making the rows in a metallic layer.

The defect D-2 results in a short circuit between two adjacent rows and hence could be recovered by making use of redundancy. The defects D-1 and D-3 would cause rejection of the device since they involve a short circuit between four and six adjacent rows respectively.

Using the innovative ideas of the present invention the rows of FIG. 4 were interrupted at several points giving rise to the rows of FIG. 5. In practice, pairs of rows were taken into consideration, the rows of each pair were interrupted at the same positions, and adjacent pairs were interrupted in alternating positions.

As may be seen in FIG. 5, now the defect D-2 no long causes problems because it does not affect any row and the defects D-1 and D-3 affect a short circuit of only two adjacent rows and hence can be redundant without causing rejects.

In this manner there can be achieved a statistical reduction of rejects.

In a sample embodiment, where the number of cells connected to a wordline is 1024, the length of each strap is e.g. 128 cells. The pitch of metal2 is 2.4 µm (linewidth 2.2 µm). The poly2 pitch, in the presently preferred embodiment, is 1.2 microns (linewidth 0.6 micron).

Figure 6:
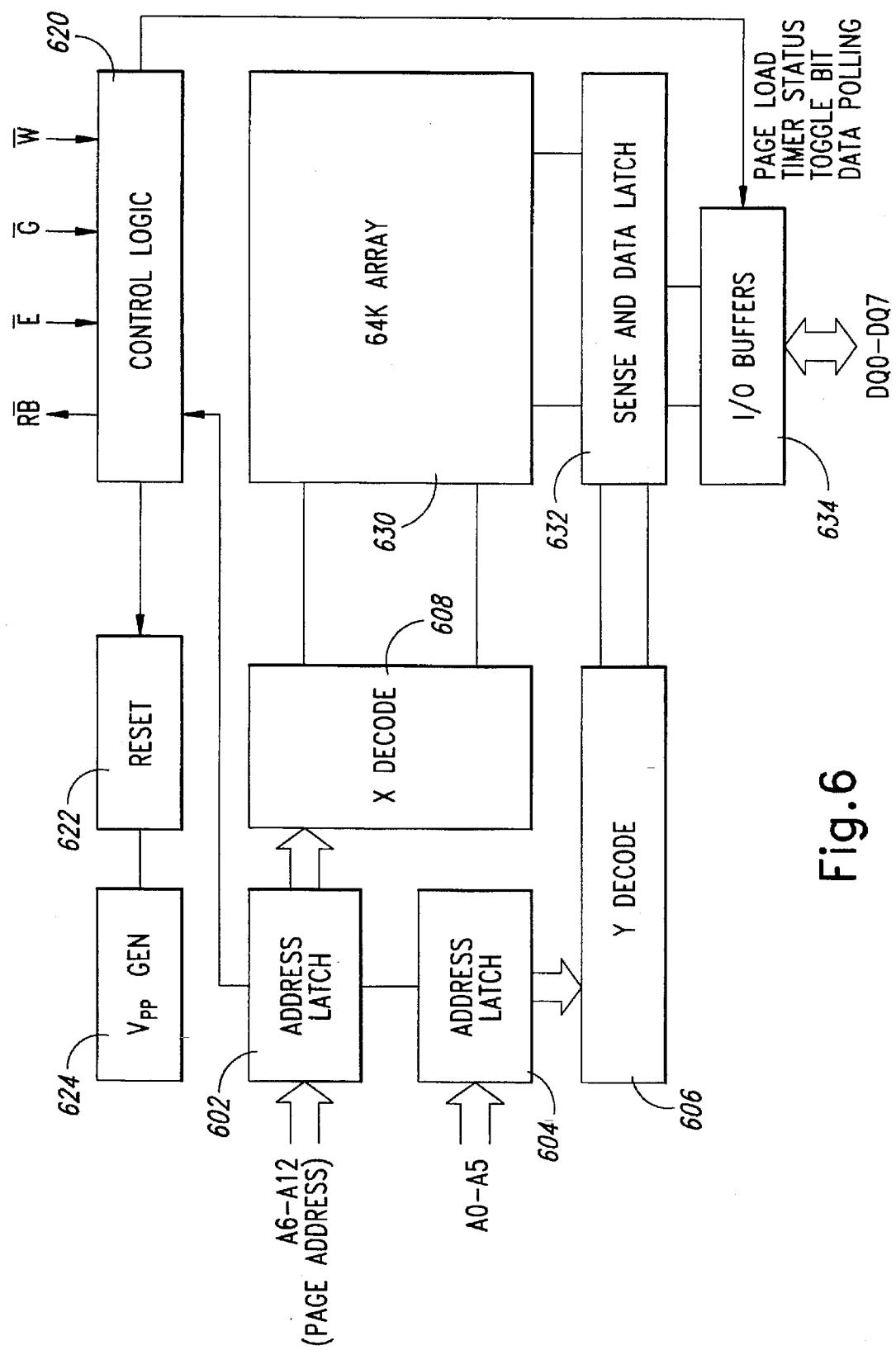
FIG. 6 shows an example of a memory chip in which this invention can advantageously be used.

FIG. 6 shows an example of a memory chip in which this invention can advantageously be used. This is an 8K×8 low-power EEPROM, but of course the disclosed innovative device structure can also be used in many other specific integrated circuits.

In this example, Address Latch 604 receives the low-order Address bits A0–A5, and Address Latch 602 receives the higher-order (page address) Address bits A6–A12. The Address Latch 604 drives a Y Decode block 606, which provides corresponding output signals to a sense and data latch 632. Similarly, the Address Latch 602 provides address bits to the X Decode circuitry 608. The X Decode circuitry 608, when enabled by the control logic 620, activates selected word lines of a 64K array of memory cells 630. Similarly, the sense and data latch 632 provides a data interface to the columns of this memory array. I/O buffers 635 provide an external connection from the sense and data latch 632 to external data lines DQ0–DQ7. Note that this interface is bi-directional. Control logic 620 sends and receives external control signals, including RB, E, G, and W, and correspondingly provides control signals to other elements on chip. Note that the control logic 620 also drives a reset logic 622, which is connected to a Vpp Generator circuit 624.

Figure 7:
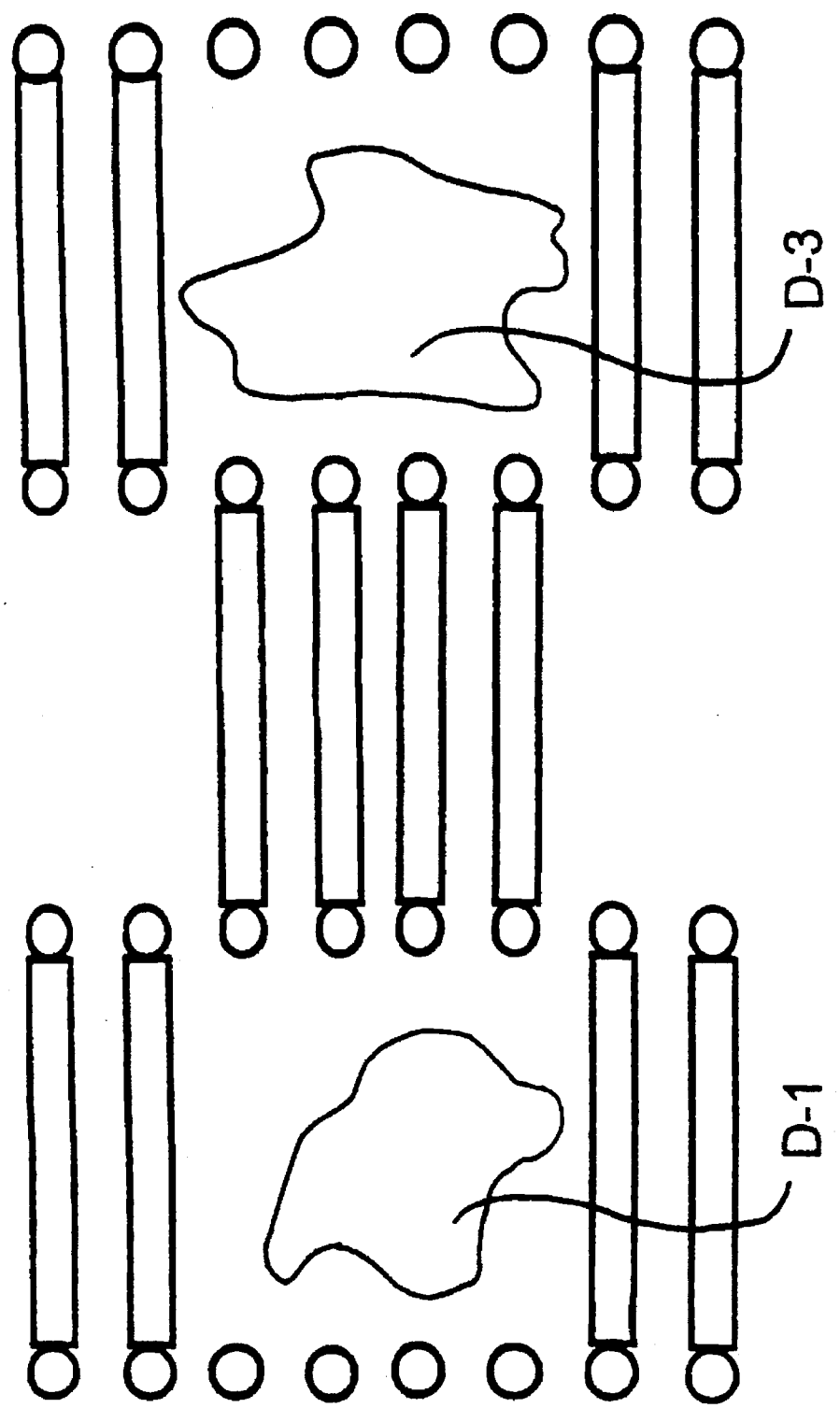

FIG. 7 is a modification of FIG. 4, in that the rows containing the defect D-2 have been removed to illustrate another possible arrangement of the interruptions of the rows in groups of four. As may be seen in FIG. 7, defects D-1 and D-3 no longer cause any problems because they do not affect any row.

According to a disclosed class of innovative embodiments, there is provided: An integrated circuit memory comprising: an array of memory cells arranged in rows and columns; a plurality of word lines each connected to plural cells in at least one respective row of the array; a plurality of bitlines each connected to plural cells in at least one respective column of the array; and strapping connections, formed in an additional thin film layer, each connecting two separate locations of a respective one of the word lines to shunt the resistivity of a respective portion of the respective word line; wherein the strapping connections are arranged, in groups, in a checkerboard pattern over the array.

According to another disclosed class of innovative embodiments, there is provided: An integrated circuit memory comprising: an array of memory cells arranged in rows and columns; a plurality of word lines each connected to plural cells in at least one respective row of the array; a plurality of bitlines each connected to plural cells in at least one respective column of the array; and strapping connections, formed in an additional thin film layer, each connecting two separate locations of a respective one of the word lines to shunt the resistivity of a respective portion of the respective word line; wherein the strapping connections provide only discontinuous shunting of the word lines, and at least some of the strapping connections are adjacent to other strapping connections.

According to another disclosed class of innovative embodiments, there is provided: An integrated circuit memory comprising: an array of memory cells arranged in rows and columns; a plurality of word lines each connected to plural cells in at least one respective row of the array; a plurality of bitlines each connected to plural cells in at least one respective column of the array; and strapping connections, formed in an additional thin film layer, each connecting two separate locations of a respective one of the word lines to shunt the resistivity of a respective portion of the respective word line; wherein the strapping connections are arranged, in groups, in a regular pattern over the array such that at least some of the strapping connections in the pattern are laterally adjacent to exactly one other strapping connection.

According to another disclosed class of innovative embodiments, there is provided: An integrated circuit comprising: a) a first plurality of first conductors a first material with relatively low conductivity and each having a plurality of first electrical connection points arranged along itself, and b) a second corresponding plurality of second conductors made of a second material with relatively high conductivity and each having a plurality of second electrical connection points along itself and the plurality of first points being electrically connected to the plurality of second points respectively in such a manner as to reduce the series resistance of the first conductors and characterized in that the second conductors are interrupted between some second consecutive points in such a manner as to leave relatively large areas of the integrated circuit not traversed by the second conductors.

According to another disclosed class of innovative embodiments, there is provided: A method for fabricating an integrated circuit memory, comprising the steps of: fabricating an array of memory cells arranged in rows and columns, and a plurality of word lines each connected to plural cells in at least one respective row of the array, and a plurality of bitlines each connected to plural cells in at least one respective column of the array; and forming strapping connections, in an additional thin film layer which is not otherwise used in the array or memory cells; wherein each the strapping connection connects two separate locations of a respective one of the word lines to shunt the resistivity of a respective portion of the respective word line; wherein the strapping connections are arranged, in groups, in a checkerboard pattern over the array.

According to another disclosed class of innovative embodiments, there is provided: A method for fabricating an integrated circuit memory, comprising the steps of: fabricating an array of memory cells arranged in rows and columns, and a plurality of word lines each connected to plural cells in at least one respective row of the array, and a plurality of bitlines each connected to plural cells in at least one respective column of the array; and forming strapping connections, in an additional thin film layer which is not otherwise used in the array or memory cells; wherein each the strapping connection connects two separate locations of a respective one of the word lines to shunt the resistivity of a respective portion of the respective word line; wherein the strapping connections provide only discontinuous shunting of the word lines, and at least some of the strapping connections are adjacent to other strapping connections.

According to another disclosed class of innovative embodiments, there is provided: A method for fabricating an integrated circuit memory, comprising the steps of: fabricating an array of memory cells arranged in rows and columns, and a plurality of word lines each connected to plural cells in at least one respective row of the array, and a plurality of bitlines each connected to plural cells in at least one respective column of the array; and forming strapping connections, in an additional thin film layer which is not otherwise used in the array or memory cells; wherein each the strapping connection connects two separate locations of a respective one of the word lines to shunt the resistivity of a respective portion of the respective word line; wherein the strapping connections are arranged, in groups, in a regular pattern over the array such that at least some of the strapping connections in the pattern are laterally adjacent to exactly one other strapping connection.

According to another disclosed class of innovative embodiments there is provided: an integrated circuit memory wherein said memory cells are non-volatile memory cells.

According to another disclosed class of innovative embodiments there is provided: an integrated circuit memory wherein the strapping connections are arranged in groups of two.

According to another disclosed class of innovative embodiments there is provided: an integrated circuit memory wherein the strapping connections are arranged in groups of four.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, the disclosed interconnect topology can be applied to strapping busses, or to strapping lines of a logic array.

For another example, the disclosed interconnect topology can be applied to processes which include more than two levels of metal and/or more than two levels of polysilicon or polycide.

In the presently preferred embodiment, the disclosed inventions are applied to a structure wherein the transistor channels are in a bulk monocrystalline silicon substrate; but alternatively the disclosed inventions can be applied to a structure using thin-film transistors, i.e. transistors with polysilicon or polySiGe channels.

In the embodiment described above, the disclosed inventions are applied to a structure which includes only MOS devices; but alternatively the disclosed inventions can also be applied to structures which also include bipolar transistors (as long as the current density is low enough that the interrupted shunts can provide an adequate reduction in series resistance). For another example, the disclosed interconnect topology can be applied to processes which include more than two levels of metal and/or more than two levels of polysilicon or polycide.

What is claimed is:

1. An integrated circuit memory comprising:
an array of memory cells arranged in rows and columns;
a plurality of word lines each connected to plural cells in at least one respective row of said array;
a plurality of bitlines each connected to plural cells in at least one respective column of said array; and
strapping connections, formed in a thin film layer, each connecting two separate locations of a respective one of said word lines to shunt the resistivity of a respective portion of said respective word line;
wherein said strapping connections do not cover the entire length of at least one of said word lines;
wherein said strapping connections are arranged, in groups, in a checkerboard pattern over said array.

2. The integrated circuit of claim 1, wherein said groups are groups of two.

3. The integrated circuit of claim 1, wherein said groups are groups of four.

4. The integrated circuit of claim 1, wherein said memory cells are non-volatile memory cells.

5. An integrated circuit memory comprising:
an array of memory cells arranged in rows and columns;
a plurality of word lines each connected to plural cells in at least one respective row of said array;
a plurality of bitlines each connected to plural cells in at least one respective column of said array; and
strapping connections, formed in a thin film layer, each connecting two separate locations of a respective one of said word lines to shunt the resistivity of a respective portion of said respective word line;
wherein said strapping connections do not cover the entire length of at least one of said word lines;
wherein said strapping connections are arranged in groups, and at least some of said strapping connections are adjacent to other said strapping connections.

6. The integrated circuit of claim 5, wherein said groups are groups of two.

7. The integrated circuit of claim 5, wherein said groups are groups of four.

8. The integrated circuit of claim 5, wherein said memory cells are non-volatile memory cells.

9. An integrated circuit memory comprising:
an array of memory cells arranged in rows and columns;
a plurality of word lines each connected to plural cells in at least one respective row of said array;
a plurality of bitlines each connected to plural cells in at least one respective column of said array; and
strapping connections, formed in a thin film layer, each connecting two separate locations of a respective one of said word lines to shunt the resistivity of a respective portion of said respective word line;
wherein said strapping connections do not cover the entire length of at least one of said word lines;
wherein said strapping connections are arranged, in groups, in a regular pattern over said array such that at least some of said strapping connections in said pattern are laterally adjacent to exactly one other said strapping connection.

10. The integrated circuit of claim 9, wherein said groups are groups of two.

11. The integrated circuit of claim 9, wherein said groups are groups of four.

12. The integrated circuit of claim 9, wherein said memory cells are non-volatile memory cells.

13. An integrated circuit comprising:
a) a plurality of first conductors each made of a first material with relatively low conductivity and each having a plurality of first electrical connection points arranged along itself, and
b) a plurality of second conductors each made of a second material with relatively high conductivity and each having a plurality of second electrical connection points along itself; said plurality of first points being electrically connected to said plurality of second points respectively in such a manner as to reduce the series resistance of the first conductors; said second conductors being interrupted between some consecutive second points in such a manner as to leave areas of the integrated circuit not traversed by said second conductors.

14. The integrated circuit of claim 13 wherein said second conductors are interrupted every two second consecutive points.

15. The integrated circuit of claim 13 wherein said second conductors are interrupted at alternating positions.

16. The integrated circuit of claim 13 wherein said second conductors are interrupted at adjacent positions.

17. The integrated circuit of claim 13 wherein the distances between some of said first and second consecutive points are equal.

18. The integrated circuit of claim 13 wherein some of said first conductors are in a parallel relation to their respective said second conductors.

19. The integrated circuit of claim 13 wherein said first and second points are electrically connected together by means of VIAs.

20. The integrated circuit of claim 13 wherein said first material is polysilicon or silicide and said second material is metallic.

21. The integrated circuit of claim 13 wherein some of said first and said second conductors are respectively superimposed.

22. Semiconductor memory device consisting of an integrated circuit comprising:

a) a plurality of first conductors each made of a first material with relatively low conductivity and each having a plurality of first electrical connection points arranged along itself, and b) a plurality of second conductors each made of a second material with relatively high conductivity and each having a plurality of second electrical connection points along itself; said plurality of first points being electrically connected to said plurality of second points respectively in such a manner as to reduce the series resistance of the first conductors; said second conductors being interrupted between some consecutive second points in such a manner as to leave areas of the integrated circuit not traversed by said second conductors.

23. A method for fabricating an integrated circuit memory, comprising the steps of:

fabricating an array of memory cells arranged in rows and columns, and a plurality of word lines each connected to plural cells in at least one respective row of said array, and a plurality of bitlines each connected to plural cells in at least one respective column of said array; and forming strapping connections, in a thin film layer which is not otherwise used in said array or memory cells; wherein each said strapping connection connects two separate locations of a respective one of said word lines to shunt the resistivity of a respective portion of said respective word line;

wherein said strapping connections do not cover the entire length of at least one of said word lines;

wherein said strapping connections are arranged, in groups, in a checkerboard pattern over said array.

24. The method of claim 23, wherein said groups are groups of two.

25. The method of claim 23, wherein said groups are groups of four.

26. The method of claim 23, wherein said memory cells are non-volatile memory cells.

27. A method for fabricating an integrated circuit memory, comprising the steps of:

fabricating an array of memory cells arranged in rows and columns, and a plurality of word lines each connected to plural cells in at least one respective row of said array, and a plurality of bitlines each connected to plural cells in at least one respective column of said array; and forming strapping connections, a thin film layer which is not otherwise used in said array or memory cells; wherein each said strapping connection connects two separate locations of a respective one of said word lines to shunt the resistivity of a respective portion of said respective word line;

wherein said strapping connections do not cover the entire length of at least one of said word lines;

wherein said strapping connections are arranged in groups, and at least some of said strapping connections are adjacent to other strapping connections.

28. The method of claim 27, wherein said groups are groups of two.

29. The method of claim 27, wherein said groups are groups of four.

30. The method of claim 27, wherein said memory cells are non-volatile memory cells.

31. A method for fabricating an integrated circuit memory, comprising the steps of:

fabricating an array of memory cells arranged in rows and columns, and a plurality of word lines each connected to plural cells in at least one respective row of said array, and a plurality of bitlines each connected to plural cells in at least one respective column of said array; and forming strapping connections, in a thin film layer which is not otherwise used in said array or memory cells; wherein each said strapping connection connects two separate locations of a respective one of said word lines to shunt the resistivity of a respective portion of said respective word line;

wherein said strapping connections do not cover the entire length of at least one of said word lines;

wherein said strapping connections are arranged, in groups, in a regular pattern over said array such that at least some of said strapping connections in said pattern are laterally adjacent to exactly one other said strapping connection.

32. The method of claim 31, wherein said groups are groups of two.

33. The method of claim 31, wherein said groups are groups of four.

34. The method of claim 31, wherein said memory cells are non-volatile memory cells.

35. Semiconductor memory device consisting of an integrated circuit comprising:

memory cells of the EPROM type;

a plurality of first conductors each made of a first material with relatively low conductivity and each having a plurality of first electrical connection points arranged along itself; and a plurality of second conductors each made of a second material with relatively high conductivity and each having a plurality of second electrical connection points along itself; said plurality of first points being electrically connected to said plurality of second points respectively in such a manner as to reduce the series resistance of the first conductors; said second conductors being interrupted between some consecutive second points in such a manner as to leave areas of the integrated circuit not traversed by said second conductors.

* * * * *